US009170502B2

(12) United States Patent
Finders (10) Patent No.: US 9,170,502 B2
(45) Date of Patent: Oct. 27, 2015

(54) METHOD OF OPTIMIZING A LITHOGRAPHIC PROCESS, DEVICE MANUFACTURING METHOD, LITHOGRAPHIC APPARATUS, COMPUTER PROGRAM PRODUCT AND SIMULATION APPARATUS

(75) Inventor: Jozef Maria Finders, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 761 days.

(21) Appl. No.: 13/277,830

(22) Filed: Oct. 20, 2011

(65) Prior Publication Data

US 2012/0099091 A1   Apr. 26, 2012

Related U.S. Application Data

(60) Provisional application No. 61/405,906, filed on Oct. 22, 2010.

(51) Int. Cl.
*G03F 7/20* (2006.01)

(52) U.S. Cl.
CPC ...................... *G03F 7/705* (2013.01)

(58) Field of Classification Search
CPC . G03F 7/70125; G03F 7/705; G03F 7/70258; G03F 7/70091; G03F 7/70141
USPC ................................. 355/53, 67, 77
See application file for complete search history.

(56) References Cited

U.S. PATENT DOCUMENTS

| | | | |
|---|---|---|---|
| 5,661,546 A * | 8/1997 | Taniguchi | 355/53 |
| 6,337,662 B1 | 1/2002 | Cassel | |
| 6,809,797 B2 * | 10/2004 | Baselmans et al. | 355/52 |
| 6,871,337 B2 | 3/2005 | Socha | |
| 6,934,009 B2 * | 8/2005 | Terashi | 355/67 |
| 6,977,714 B2 * | 12/2005 | Finders | 355/52 |
| 7,015,491 B2 | 3/2006 | Eurlings et al. | |
| 7,525,639 B2 * | 4/2009 | Yamada | 355/55 |
| 7,525,640 B2 * | 4/2009 | Jansen et al. | 355/67 |
| 7,525,642 B2 | 4/2009 | Mulder et al. | |
| 2002/0152452 A1 | 10/2002 | Socha | |

(Continued)

FOREIGN PATENT DOCUMENTS

| | | |
|---|---|---|
| JP | 2002-082285 | 3/2002 |
| JP | 2002-132986 | 5/2002 |

(Continued)

OTHER PUBLICATIONS

Japanese Office Action mailed Oct. 22, 2012 in corresponding Japanese Patent Application No. 2011-226484.

*Primary Examiner* — Steven H Whitesell Gordon
(74) *Attorney, Agent, or Firm* — Pillsbury Winthrop Shaw Pittman LLP (57) ABSTRACT

A method of optimizing a lithographic process for imaging a pattern, including a plurality of features, onto a substrate using a lithographic apparatus, the lithographic apparatus having a controllable illumination system to illuminate a patterning device and a controllable projection system to project an image of the patterning device onto the substrate, the method including selecting a feature from the plurality of features, determining an illumination setting for the illumination system to optimize imaging of the selected feature, and determining a projection setting for the projection system to optimize imaging of the selected feature taking account of the illumination setting.

22 Claims, 3 Drawing Sheets

(56) References Cited

U.S. PATENT DOCUMENTS

| | | |
|---|---|---|
| 2004/0158809 A1* | 8/2004 | Kashimoto et al. ............ 716/21 |
| 2004/0207824 A1 | 10/2004 | Lof et al. |
| 2005/0286035 A1 | 12/2005 | Troost et al. |
| 2006/0001890 A1 | 1/2006 | Poultney |
| 2006/0038968 A1 | 2/2006 | Kemper et al. |
| 2006/0126046 A1* | 6/2006 | Hansen ........................ 355/55 |
| 2007/0273853 A1* | 11/2007 | Bleeker et al. ................. 355/46 |
| 2008/0212046 A1 | 9/2008 | Riepen et al. |
| 2009/0174877 A1 | 7/2009 | Mulder et al. |
| 2009/0262318 A1 | 10/2009 | Van Den Dungen et al. |
| 2009/0279060 A1 | 11/2009 | Direcks et al. |
| 2009/0279062 A1 | 11/2009 | Direcks et al. |
| 2010/0123887 A1 | 5/2010 | De Winter et al. |
| 2010/0129742 A1 | 5/2010 | De Winter et al. |
| 2010/0265479 A1 | 10/2010 | De Winter et al. |

FOREIGN PATENT DOCUMENTS

| | | |
|---|---|---|
| JP | 2002-334836 | 11/2002 |
| JP | 2003-218024 | 7/2003 |
| JP | 2004-054263 | 2/2004 |
| JP | 2006-013518 | 1/2006 |
| JP | 2006-019753 | 1/2006 |
| JP | 2007-317847 | 12/2007 |
| JP | 2009-223330 | 10/2009 |
| JP | 2009-302206 | 12/2009 |
| JP | 2010-087389 | 4/2010 |
| JP | 2010-182718 | 8/2010 |
| WO | 99/49504 | 9/1999 |
| WO | 2009/060745 | 5/2009 |

* cited by examiner

METHOD OF OPTIMIZING A LITHOGRAPHIC PROCESS, DEVICE MANUFACTURING METHOD, LITHOGRAPHIC APPARATUS, COMPUTER PROGRAM PRODUCT AND SIMULATION APPARATUS

This application claims priority and benefit under 35 U.S.C. §119(e) to U.S. Provisional Patent Application No. 61/405,906, entitled "Method Of Optimizing A Lithographic Process, Device Manufacturing Method, Lithographic Apparatus, Computer Program Product and Simulation Apparatus", filed on Oct. 22, 2010. The content of that application is incorporated herein in its entirety by reference.

FIELD

The present invention relates to a method of optimizing a lithographic process, a device manufacturing method, a lithographic apparatus, a computer program product to control a lithographic apparatus, and a simulation apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

In lithography, the manner of illumination of the patterning device, in particular the angles at which the exposure radiation is incident on the patterning device, affects the image printed on the substrate. Illumination modes are commonly, and most conveniently, described by describing the distribution of radiation in a pupil plane in the illumination system that is a Fourier transform of the patterning device plane. Thus, position in the pupil plane corresponds to angle at the patterning device plane. So-called conventional illumination has a disc of radiation in the pupil plane centered on the origin and results in the patterning device being illuminated with radiation arriving at a range of angles centered around the normal. Annular illumination has an annulus of radiation in the pupil plane. Off-axis multi-pole arrangements have, commonly, two or four poles arranged symmetrically about the origin, either on or off the X and Y axes. These different modes are known to be suitable for different types of pattern to be imaged. Complex patterns may require a complex illumination mode for optimum imaging.

A diffractive optical element (DOE) can be used that is custom made and placed in the illumination system in a plane conjugate with the patterning device but closer to the radiation source than the pupil plane in order to define a desired illumination distribution in the pupil plane.

SUMMARY

Design and manufacture of the diffractive optical element is expensive and time-consuming. As a solution, an arrangement may be used to enable any desired illumination mode to be generated using a programmable array of individually-adjustable micro-mirrors. For a given pattern to be illuminated, a process known as source-mask optimization (SMO) may be used to determine the optimum illumination mode for the patterning device pattern.

The projection system used in optical lithography is manufactured to extremely high tolerances and maintained in extremely stable conditions in order to reduce or minimize aberrations and/or other imaging errors. Various adjustable elements may be included in the projection system to enable correction of errors. One such adjustable element may be a device to adjust the phase of the patterned projection beam in a pupil plane of the projection system using a programmable device.

In lithography using an advanced optical lithography apparatus, the number of parameters of the apparatus that can be adjusted to optimize illumination, in particular where programmable illumination and programmable phase correction is available, is extremely large. A complete simulation of the imaging of a desired pattern in order to optimize the imaging parameters is desirable but at present is not feasible due to the computational load required. Separate optimization of multiple parameters may result in a sub-optimal set of settings for the process. Optimization of one imaging metric using one set of parameters may have an undesirable effect on another imaging metric. It is not always possible to arrange physical or logical manipulators that are orthogonal to one another and directed to respective metrics.

It is desirable, for example, to provide a methodology to improve or optimize multiple parameters of a lithographic apparatus to provide a globally improved or optimal set of settings.

According to an aspect of the invention, there is provided a method of optimizing a lithographic process for imaging a pattern comprising a plurality of features onto a substrate using a lithographic apparatus, the lithographic apparatus having a controllable illumination system arranged to illuminate a patterning device with radiation and a controllable projection system arranged to project an image of the patterning device onto the substrate as a patterned beam of radiation, the method comprising:

selecting a feature from the plurality of features;

determining an illumination setting for the illumination system to optimize imaging of the selected feature; and determining a projection setting for the projection system to optimize imaging of the selected feature taking account of the illumination setting.

According to an aspect of the invention, there is provided a device manufacturing method using a lithographic apparatus, the lithographic apparatus having a controllable illumination system arranged to illuminate a patterning device with radiation and a controllable projection system arranged to project an image of the patterning device onto the substrate as a patterned beam of radiation, the method comprising:

selecting a feature from a plurality of features of a pattern;

determining an illumination setting for the illumination system to optimize imaging of the selected feature;

determining a projection setting for the projection system to optimize imaging of the selected feature taking account of the illumination setting; and imaging the pattern onto the substrate using the illumination setting and the projection setting.

According to an aspect of the invention, there is provided a lithographic apparatus arranged to image a pattern comprising a plurality of features onto a substrate, the lithographic apparatus comprising:

a controllable illumination system arranged to illuminate a patterning device with radiation;

a controllable projection system arranged to project an image of the patterning device onto the substrate as a patterned beam of radiation; and a control system arranged to:

select a feature from the plurality of features;

determine an illumination setting for the illumination system to optimize imaging of the selected feature; and determine a projection setting for the projection system to optimize imaging of the selected feature taking account of the illumination setting.

According to an aspect of the invention, there is provided a computer program product comprising a computer-readable storage medium having stored thereon instructions to perform a method of optimizing a lithographic process for imaging a pattern comprising a plurality of features onto a substrate using a lithographic apparatus, the method comprising:

selecting a feature from the plurality of features;

determining an illumination setting for an illumination system of the lithographic apparatus to optimize imaging of the selected feature; and determining a projection setting for a projection system of the lithographic apparatus to optimize imaging of the selected feature taking account of the illumination setting.

According to an aspect of the invention, there is provided a simulation apparatus to simulate a device manufacturing method using a lithographic apparatus, the lithographic apparatus having a controllable illumination system arranged to illuminate a patterning device and a controllable projection system arranged to project an image of the patterning device onto the substrate, the simulation apparatus comprising:

a memory configured to store a representation of a pattern comprising a plurality of features;

a selector configured to select a feature of the plurality of features;

a processor configured to determine an illumination setting for the illumination system to optimize imaging of the selected feature and to determine a projection setting for the projection system to optimize imaging of the selected feature taking account of the illumination setting; and a simulator configured to simulate imaging of the pattern onto the substrate using the illumination setting and the projection setting.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
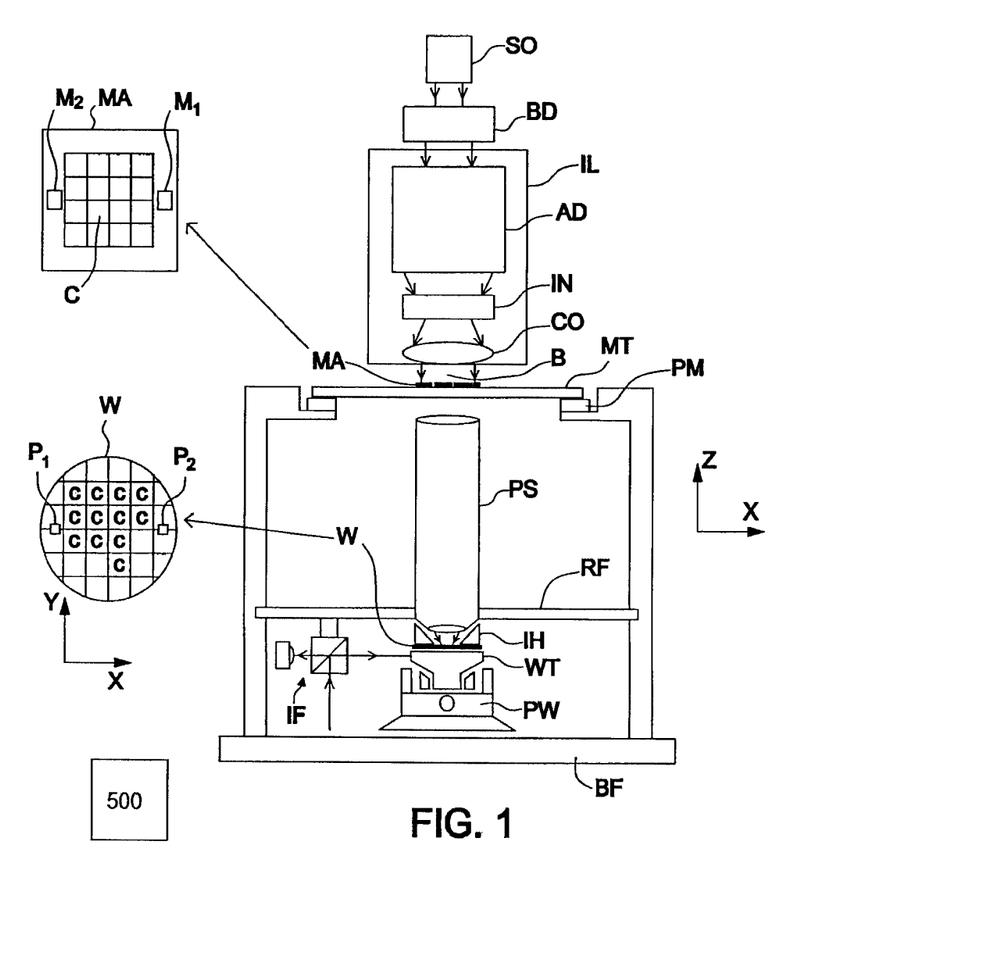
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a lithographic apparatus, a fluid, in particular a liquid, may be provided between the final element of the projection system to enable imaging of smaller features and/or increase the effective NA of the apparatus. An embodiment of the invention is described herein with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices IH of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5.

Figure 2:
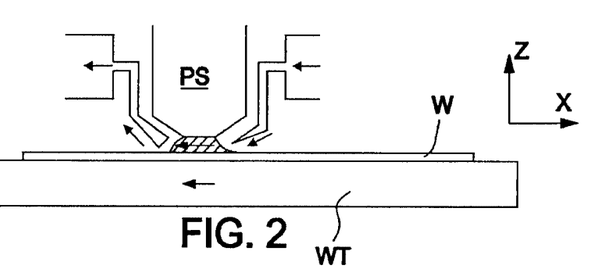
FIGS. 2 and 3 depict a liquid supply system for use in a lithographic projection apparatus.
Figure 3:
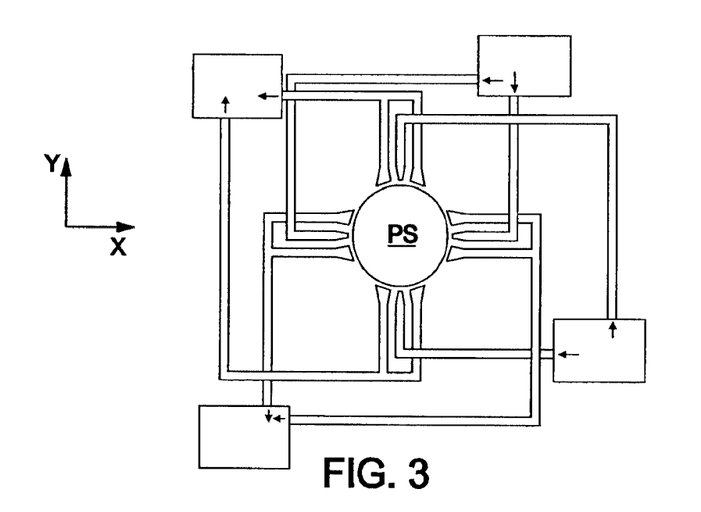

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication No. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
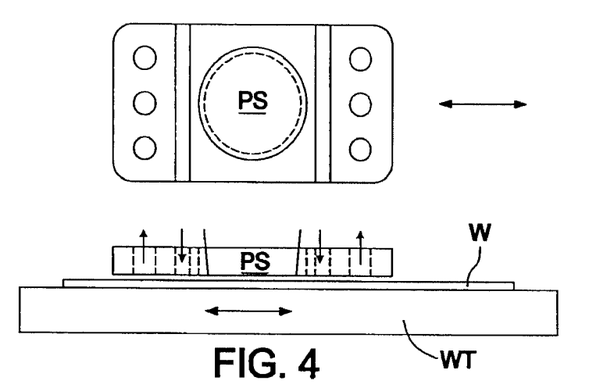
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

Figure 5:
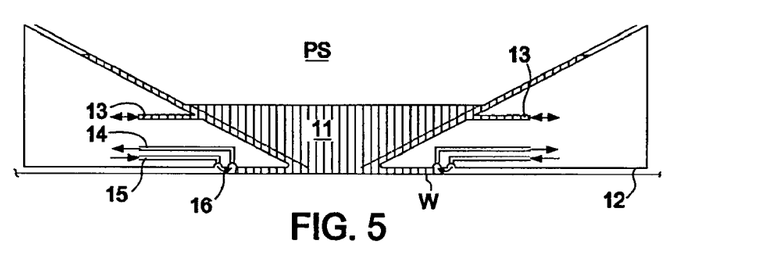
FIG. 5 depicts, in cross-section, a barrier member which may be used in an embodiment of the present invention as an immersion liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a fluid handling structure 12. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Another arrangement which is possible is one which works on a gas drag principle. The so-called gas drag principle has been described, for example, in United States patent application publication nos. US 2008-0212046, US 2009-0279060 and US 2009-0279062. In that system the extraction holes are arranged in a shape which desirably has a corner. The corner may be aligned with the stepping or scanning directions. This reduces the force on the meniscus between two openings in the surface of the fluid handing structure for a given speed in the step or scan direction compared to if the two outlets were aligned perpendicular to the direction of scan.

Also disclosed in US 2008-0212046 is a gas knife positioned radially outside the main liquid retrieval feature. The gas knife traps liquid which gets past the main liquid retrieval feature. Such a gas knife may be present in a so called gas drag principle arrangement (as disclosed in US 2008-0212046), in a single or two phase extractor arrangement (such as disclosed in United States patent application publication no. US 2009-0262318) or any other arrangement.

Many other types of liquid supply system are possible. The present invention is not limited to any particular type of liquid supply system, nor to immersion lithography. The invention may be applied equally in any lithography.

A control system 500 controls the overall operations of the lithographic apparatus and in particular performs an optimization process described further herein. Control system 500 may be embodied as a suitably-programmed computer comprising a central processing unit and volatile and non-volatile storage. The control system 500 may include an input and/or output device such as a keyboard and/or screen, a connection to a network, and/or an interface to various parts of the lithographic apparatus. It will be appreciated that a one-to-one relationship between controlling computer and lithographic apparatus is not necessary. In an embodiment of the invention one computer may control multiple lithographic apparatus. In another embodiment of the invention, multiple networked computers may be used to control one lithographic apparatus. The control system 500 may also be configured to control one or more associated process devices and/or substrate handling devices in a lithocell or cluster of which the lithographic apparatus forms a part. The control system 500 can be configured to be subordinate to a supervisory control system of a lithocell or cluster and/or an overall control system of a fab.

Three-dimensional (3D) patterning device effects, that is effects arising from the fact that the patterning device (e.g., a reticle or mask) has a three-dimensional structure and is not an idealized planar structure as is often assumed for simulation of lithographic procedures, can have a significant effect on the imaging and placement of features. These effects may be of concern in lithography using 193 nm exposure radiation at the 22 nm and smaller nodes. However, the effects may also occur at other nodes and other wavelengths (such as the wavelengths of extreme ultraviolet (EUV) radiation) and can be expected to become increasingly serious with continued reduction in the critical dimension. Based on results of experimentation and simulation with a 45 nm flash memory-like pattern, patterning device 3D effects may cause significant image placement errors and/or variations in best focus and top-bottom asymmetries. Correction for all of these issues is difficult, if not impossible, with known imaging optimization methodologies.

Figure 6:
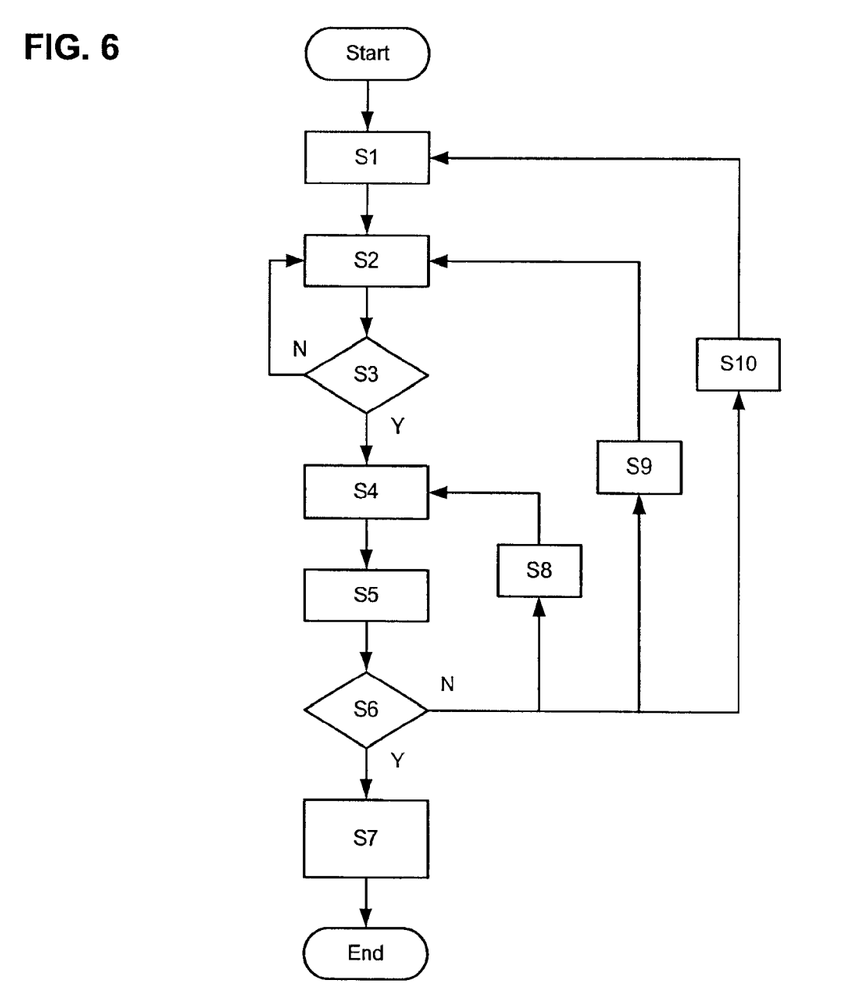
FIG. 6 is a flow chart of a method according to an embodiment of the invention of optimizing a device manufacturing method.

A method of optimizing an imaging process according to an embodiment of the invention is shown in FIG. 6. The steps of the method are, in an embodiment, automated but manual intervention in certain selection steps may be allowed. In an embodiment of the present invention, the optimized process recipe and the outputs of optimization steps need not be globally optimum solutions. Rather the term optimization is used herein to refer to a process that identifies values for imaging parameters that provide an improvement, e.g. a local optimum, in at least one relevant metric, compared to an initial set of values for those parameters. "Optimum" and other related terms should be construed accordingly. In an embodiment of the present invention, optimization steps can be applied iteratively to provide further improvements in one or more metrics. By way of example, optimization may provide an improvement of one or more metrics selected from the group of: feature placement accuracy, best focus difference, Bosssung tilt, pattern asymmetry, pattern asymmetry through focus, CD, CD uniformity, CD uniformity through focus, top-bottom difference.

Given a pattern to be imaged, the first step is to select, at S1, certain features and/or feature groups from the pattern to be used for the optimization process. The features or feature groups selected are desirably representative of the features contained in the pattern. They may include features of different types—dense, semi-dense or isolated—and/or orientation. In an embodiment, the features or feature groups selected may be limited to those features or feature groups that are most critical for device functionality. For the purposes of an embodiment of the present invention, a "feature" can be a part of the projected pattern that corresponds to the whole or part of a feature that appears in a layer of the final device and/or the whole or part of a non-imaging feature such as an assist feature or serif. The pattern (typically comprising a layout in a standard digital format such as OASIS, GDSII, etc.) for which the lithographic process is to be optimized may include memory features, test features and logic features. From this pattern, the initial plurality of features (also often referred to as clips) is identified. In an embodiment, a full set of features or clips is extracted from the pattern or provided together with the pattern to be projected. This full set of features or clips represents all the complicated patterns in the pattern (typically about 50 to 1000 clips, although any number of clips may be used). These features or clips represent small portions (i.e. circuits, cells or subpatterns) of the design and the clips represent small portions for which particular attention and/or verification may be required. In an embodiment, at S1, a phase assignment for the selected features or feature groups may be made.

Next, a SMO process, at S2, is performed to identify one or more optimal illumination settings, i.e., an optimal illumination mode and/or other illumination parameter, to image the select features or feature groups. Known SMO methods and software may be used. Additional information regarding the use of diffractive optical elements or reflective elements to create illumination shapes in the pupil plane of the illumination system can be gleaned from U.S. Pat. Nos. 7,015,491, 6,337,662, and 7,525,642 and from U.S. patent application publication no. US 2009-0174877, the contents of each incorporated herein in its entirety by reference.

Next it is determined, at S3, whether or not 3D patterning device effects are within tolerable limits. This can be performed by a known lithographic simulator or by exposing one or more trial substrates. If the 3D patterning device effects are not tolerable, the method returns to the SMO at S2 to perform a new optimization taking into account the 3D patterning device effects.

Once an optimized illumination setting with tolerable 3D patterning device effects has been determined, the second stage of the optimization procedure is to calculate, at S4, a suitable phase and/or polarization filter to minimize aberrations and/or other undesirable imaging effects. Polarization of the patterned beam can be an important parameter affecting imaging quality. However, sensitivity to polarization is pattern-dependent and therefore polarization control can be omitted in an embodiment but in another embodiment can be more important than phase control. Additional information regarding the use of a programmable filter in the pupil plane of the projection system can be gleaned from U.S. Pat. No. 7,525,640, from U.S. patent application publication nos. 2010/0123887, 2010/0129742, and 2010-0265479, the contents of each incorporated herein in its entirety by reference.

Having now selected an illumination setting and a phase and/or polarization filter, the next step, at S5, is to calculate the effects of these on the complete pattern to be imaged. In an embodiment an overall process window for the selected features is also calculated. In an embodiment, the effects of the illumination setting and the phase and/or polarization filter can be determined by trial exposures of substrates.

On the basis of the effects on the full pattern and the overall process window it is determined, at S6, whether or not the imaging process is adequate and has a large enough process window. If yes, the process is performed, at S7, using the optimized illumination setting and the phase and/or polarization filter. These are desirably implemented using a programmable device to define an illumination mode of the illumination setting and a programmable phase and/or polarization filter. In an embodiment, a customized diffractive optical element may be used to define an illumination mode of the illumination setting and a customized pupil plane filter can be constructed for the projection system. The process thus arrived at may be used as often as required on one or more lithographic apparatuses. If necessary, adjustments can be made for machine to machine variations.

If the determination step, at S6, determines that the imaging process will not be successful and/or has an insufficient overall process window, adjustments may be made and some or all of the optimization process repeated. According to the predicted deficiency in the process, the phase and/or polarization filter may be adjusted at S8, the illumination setting may be adjusted at S9, and/or the selection of features on which to base the optimization may be changed at S10. In an embodiment, the phase assignment for the selected features or feature groups can be adjusted. In an embodiment the source bandwidth can be optimized.

It has been estimated that the two step optimization process herein may reduce a 30 to 40 nm focus error in a known recipe for imaging a 45 nm flash memory pattern to about 10 nm. This is a significant improvement in a total focus budget of about 90 nm. An embodiment of the present invention is expected to provide a broader process window.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described herein may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The invention may further be described using the following clauses:

1. A device manufacturing method using a lithographic apparatus, the lithographic apparatus having a controllable illumination system arranged to illuminate a patterning device with radiation and a controllable projection system arranged to project an image of the patterning device onto the substrate as a patterned beam of radiation, the method comprising:
   selecting a feature from a plurality of features of a pattern;
   determining an illumination setting for the illumination system to optimize imaging of the selected feature;
   determining a projection setting for the projection system to optimize imaging of the selected feature taking account of the illumination setting; and
   imaging the pattern onto the substrate using the illumination setting and the projection setting.
2. The method according to clause 1, wherein the illumination setting comprises an illumination mode defining intensity distribution across directions of illumination of the patterning device.
3. The method according to clause 2, wherein the illumination system includes a programmable device arranged to effect the illumination mode and the illumination mode includes a custom illumination mode.
4. The method according to clause 3, wherein determining an illumination setting comprises a source-mask optimization process.
5. The method according to any of clauses 1 to 4, wherein the projection setting is a setting of a filter to adjust phase, polarization, or both phase and polarization.
6. The method according to clause 5, wherein the filter is a programmable filter.
7. The method according to clause 5 or clause 6, wherein the filter is arranged to effect a controllable local change in phase, polarization, or both phase and polarization of the patterned beam in a pupil plane of the projection system.
8. The method according to any of clauses 1 to 7, further comprising verifying the effect of the illumination setting and the projection setting on the image of a part of the pattern, the part including a feature not selected in the selecting step.
9. The method according to clause 8, further comprising taking remedial action if the result of verifying is insufficient.
10. The method according to clause 9, wherein the remedial action is selected from the group comprising:
    changing the selection of the feature;
    changing the illumination setting; and/or
    changing the projection setting.
11. The method according to clause 10, further comprising repeating the determining steps.
12. The method according to any of clauses 8 to 11, wherein the verifying comprises simulating the image of the part or exposing the part on a substrate.
13. A method of optimizing a lithographic process for imaging a pattern comprising a plurality of features onto a substrate using a lithographic apparatus, the lithographic apparatus having a controllable illumination system arranged to illuminate a patterning device with radiation and a controllable projection system arranged to project an image of the patterning device onto the substrate as a patterned beam of radiation, the method comprising:
    selecting a feature from the plurality of features;
    determining an illumination setting for the illumination system to optimize imaging of the selected feature; and
    determining a projection setting for the projection system to optimize imaging of the selected feature taking account of the illumination setting.
14. The method according to clause 13, wherein the illumination setting comprises an illumination mode defining intensity distribution across directions of illumination of the patterning device.
15. The method according to clause 14, wherein the illumination system includes a programmable device arranged to effect the illumination mode and the illumination mode includes a custom illumination mode.
16. The method according to clause 13, wherein determining an illumination setting comprises a source-mask optimization process.
17. The method according to any of clauses 13 to 16, wherein the projection setting is a setting of a filter to adjust phase, polarization, or both phase and polarization.
18. The method according to clause 17, wherein the filter is a programmable filter.
19. The method according to clause 17 or claim 18, wherein the filter is arranged to effect a controllable local change in phase, polarization, or both phase and polarization of the patterned beam in a pupil plane of the projection system.
20. The method according to any of clauses 13-19, further comprising verifying the effect of the illumination setting and the projection setting on the image of a part of the pattern, the part including a feature not selected in the selecting step.
21. The method according to clause 20, further comprising taking remedial action if the result of the verifying is insufficient.
22. The method according to clause 21, wherein the remedial action is selected from the group comprising:
    changing the selection of the feature;
    changing the illumination setting; and/or
    changing the projection setting.

23. The method according to clause 22, further comprising repeating the determining steps.
24. The method according to any of clauses 20 to 23, wherein the verifying comprises simulating the image of the part or exposing the part on a substrate.
25. A lithographic apparatus arranged to image a pattern comprising a plurality of features onto a substrate, the lithographic apparatus comprising:
a controllable illumination system arranged to illuminate a patterning device with radiation;
a controllable projection system arranged to project an image of the patterning device onto the substrate as a patterned beam of radiation; and
a control system arranged to:
select a feature from the plurality of features;
determine an illumination setting for the illumination system to optimize imaging of the selected feature; and
determine a projection setting for the projection system to optimize imaging of the selected feature taking account of the illumination setting.
26. The apparatus according to clause 25, wherein the illumination setting comprises an illumination mode defining intensity distribution across directions of illumination of the patterning device.
27. The apparatus according to clause 26, wherein the illumination system includes a programmable device arranged to effect the illumination mode and the illumination mode includes a custom illumination mode.
28. The apparatus according to any of clauses 25 to 27, wherein the projection setting is a setting of a filter to adjust phase, polarization, or both phase and polarization.
29. The apparatus according to clause 28, wherein the filter is a programmable filter.
30. The apparatus according to clause 28 or clause 29, wherein the filter is arranged to effect a controllable local change in phase, polarization, or both phase and polarization of the patterned beam in a pupil plane of the projection system.
31. A computer program product comprising a computer-readable storage medium having stored thereon instructions to perform a method of optimizing a lithographic process for imaging a pattern comprising a plurality of features onto a substrate using a lithographic apparatus, the method comprising:
selecting a feature from the plurality of features;
determining an illumination setting for an illumination system of the lithographic apparatus to optimize imaging of the selected feature; and
determining a projection setting for a projection system of the lithographic apparatus to optimize imaging of the selected feature taking account of the illumination setting.
32. A simulation apparatus to simulate a device manufacturing method using a lithographic apparatus, the lithographic apparatus having a controllable illumination system arranged to illuminate a patterning device and a controllable projection system arranged to project an image of the patterning device onto the substrate, the simulation apparatus comprising:
a memory configured to store a representation of a pattern comprising a plurality of features;
a selector configured to select a feature of the plurality of features;
a processor configured to determine an illumination setting for the illumination system to optimize imaging of the selected feature and to determine a projection setting for the projection system to optimize imaging of the selected feature taking account of the illumination setting; and
a simulator configured to simulate imaging of the pattern onto the substrate using the illumination setting and the projection setting.

The descriptions above are intended to be illustrative, not limiting. Thus, it will be apparent to one skilled in the art that modifications may be made to the invention as described without departing from the scope of the claims set out below.

The invention claimed is:

1. A method of optimizing a lithographic process for imaging a pattern comprising a plurality of features onto a substrate using a lithographic apparatus, the lithographic apparatus having a controllable illumination system arranged to illuminate a patterning device with radiation and a controllable projection system arranged to project an image of the patterning device onto the substrate as a patterned beam of radiation, the method comprising:
selecting a feature from the plurality of features;
determining an illumination setting for the illumination system to optimize imaging of the selected feature;
determining a projection setting for the projection system to optimize imaging of the selected feature taking account of the illumination setting; and
verifying the effect of the illumination setting and the projection setting on the image of at least a part of the pattern, the at least part of the pattern including a feature not selected in the selecting step.

2. The method according to claim 1, wherein the illumination setting comprises an illumination mode defining intensity distribution across directions of illumination of the patterning device.

3. The method according to claim 1, wherein determining an illumination setting comprises a source-mask optimization process.

4. The method according to claim 1, wherein the projection setting is a setting of a filter to adjust phase, polarization, or both phase and polarization.

5. The method according to claim 4, wherein the filter is a programmable filter.

6. The method according to claim 1, further comprising taking remedial action if the result of the verifying is insufficient.

7. The method according to claim 6, wherein the remedial action is selected from the group comprising:
changing the selection of the feature;
changing the illumination setting; and/or
changing the projection setting.

8. The method according to claim 7, further comprising repeating the determining steps.

9. The method according to claim 1, wherein the verifying comprises simulating the image of the at least part of the pattern or exposing the at least part of the pattern on a substrate.

10. An apparatus comprising:
a control system arranged to:
select a design feature from a plurality of design features of a pattern, an image of each of the plurality of features to be imaged onto a radiation-sensitive substrate;
calculate an illumination setting for a controllable illumination system to optimize imaging of an image of the selected feature; and
calculate a projection setting for a controllable projection system to optimize imaging of the image of the selected feature taking account of the illumination setting, wherein calculation of the illumination setting and/or projection setting comprises simulation or other calculation of the image of the selected feature.

11. The apparatus according to claim 10, wherein the illumination setting comprises an illumination mode defining intensity distribution across directions of illumination of the patterning device.

12. The apparatus according to claim 10, wherein the projection setting is a setting of a filter to adjust phase, polarization, or both phase and polarization.

13. The apparatus according to claim 12, wherein the filter is arranged to effect a controllable local change in phase, polarization, or both phase and polarization of the patterned beam in a pupil plane of the projection system.

14. The apparatus according to claim 10, comprising an exposure tool arranged to image the pattern onto the substrate, the exposure tool comprising the controllable illumination system, the controllable illumination system arranged to illuminate a patterning device with radiation, and comprising the controllable projection system, the controllable projection system arranged to project an image of the patterning device onto the substrate as a patterned beam of radiation.

15. The apparatus according to claim 10, wherein the control system is further configured to verify the effect of the illumination setting and the projection setting on the image of at least a part of the pattern, the at least part of the pattern including a feature other than, or in addition to, the selected feature.

16. The apparatus according to claim 15, wherein the control system is further configured to take remedial action if the result of the verifying is insufficient.

17. The apparatus according to claim 16, wherein the remedial action is selected from the group comprising:
change of the selection of the feature;
change of the illumination setting; and/or
change of the projection setting.

18. The apparatus according to claim 17, wherein the control system is further configured to repeat the calculation of the illumination setting and projection system setting.

19. The apparatus according to claim 15, wherein the verification comprises simulation of the image of the at least part of the pattern or exposing the at least part of the pattern on a substrate.

20. The apparatus according to claim 10, wherein the control system is further arranged to calculate an effect of the illumination setting and the projection setting on at least a part of the pattern, the at least part of the pattern including a feature other than, or in addition to, the selected feature.

21. A computer program product comprising a non-transitory computer-readable storage medium having stored thereon instructions to perform a method of optimizing a lithographic process for imaging a pattern comprising a plurality of features onto a substrate using a lithographic apparatus, the method comprising:
selecting a feature from the plurality of features;
determining an illumination setting for an illumination system of the lithographic apparatus to optimize imaging of the selected feature;
determining a projection setting for a projection system of the lithographic apparatus to optimize imaging of the selected feature taking account of the illumination setting; and
verifying the effect of the illumination setting and the projection setting on the image of at least a part of the pattern, the at least part of the pattern including a feature not selected in the selecting step.

22. A simulation apparatus to simulate a device manufacturing method using a lithographic apparatus, the lithographic apparatus having a controllable illumination system arranged to illuminate a patterning device and a controllable projection system arranged to project an image of the patterning device onto the substrate, the simulation apparatus comprising:
a memory configured to store a representation of a pattern comprising a plurality of features;
a selector configured to select a feature of the plurality of features;
a processor configured to determine an illumination setting for the illumination system to optimize imaging of the selected feature, to determine a projection setting for the projection system to optimize imaging of the selected feature taking account of the illumination setting, and verify the effect of the illumination setting and the projection setting on the image of at least a part of the pattern, the at least part of the pattern including a feature other than, or in addition to, the selected feature; and
a simulator configured to simulate imaging of the pattern onto the substrate using the illumination setting and the projection setting.

\* \* \* \* \*